United States Patent [19]
Collins et al.

[11] 4,372,032
[45] Feb. 8, 1983

[54] NORMALLY OFF INP FIELD EFFECT TRANSISTOR MAKING PROCESS

[75] Inventors: David A. Collins; Derek L. Lile, both of San Diego, Calif.

[73] Assignee: The United States of America as represented by the Secretary of the Navy, Washington, D.C.

[21] Appl. No.: 248,185

[22] Filed: Mar. 30, 1981

Related U.S. Application Data

[62] Division of Ser. No. 72,399, Sep. 4, 1979.

[51] Int. Cl.³ .............................................. H01L 21/24
[52] U.S. Cl. .................................. 29/571; 29/576 E; 29/591; 148/178
[58] Field of Search ................. 29/571, 589, 590, 591, 29/576 E; 148/175, 177, 178

[56] References Cited

U.S. PATENT DOCUMENTS

| | | | |
|---|---|---|---|
| 3,012,175 | 12/1961 | Jones et al. | 357/61 |
| 3,460,005 | 8/1969 | Kanda et al. | 29/571 X |
| 3,821,777 | 6/1974 | James | 148/1.5 X |
| 4,161,739 | 7/1979 | Messick | 357/61 X |
| 4,252,580 | 2/1981 | Messick | 29/571 X |

OTHER PUBLICATIONS

Balk et al., *IBM Tech. Discl. Bull.*, vol. 10, No. 8, Jan. 1968, p. 1277.

*Primary Examiner*—G. Ozaki
*Attorney, Agent, or Firm*—Robert F. Beers; Ervin F. Johnston; Harvey Fendelman

[57] ABSTRACT

A normally off insulated gate field effect transistor having a p-type single crystal InP substrate with source and drain contacts spaced apart and disposed thereon with a layer of silicon dioxide disposed over the InP material in the space between the contacts and a gate electrode disposed on the silicon dioxide to completely bridge the space between the contacts. The p-type single crystal InP substrate may be replaced by a p-type epitaxial InP material disposed on a semi-insulating InP substrate.

6 Claims, 5 Drawing Figures

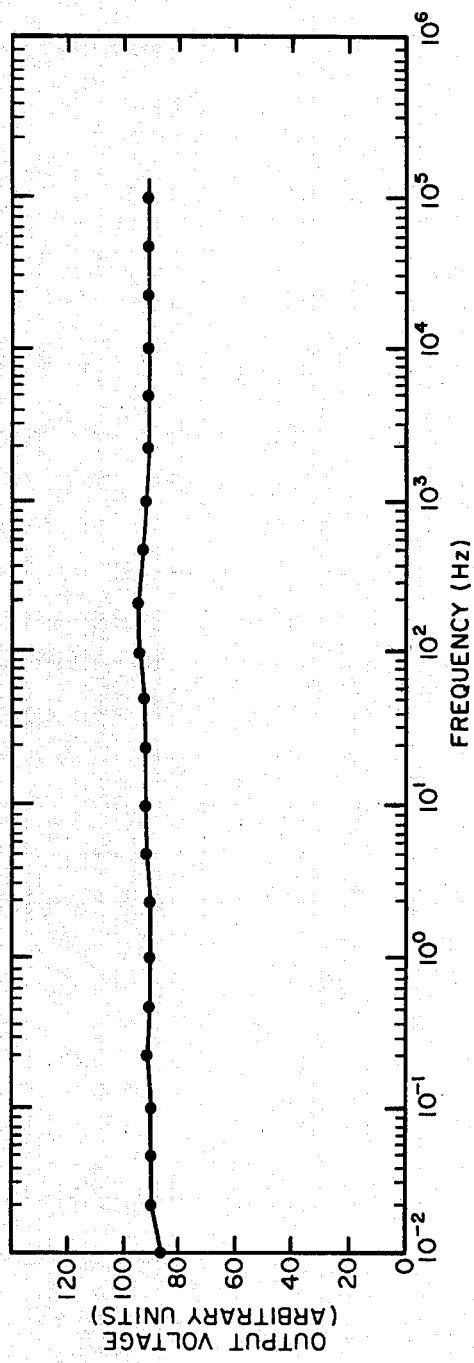
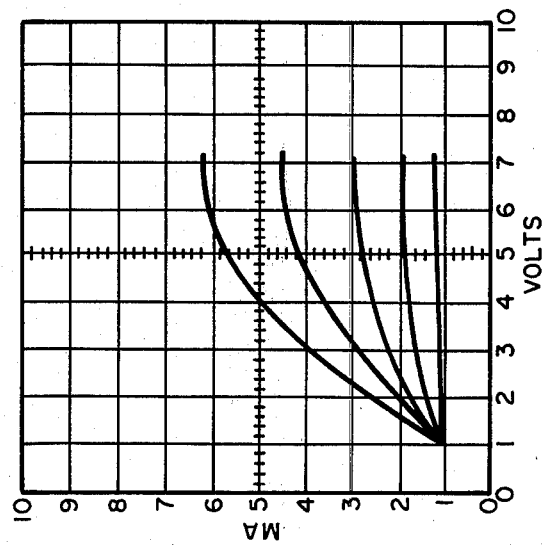

NORMALLY OFF INP FIELD EFFECT TRANSISTOR MAKING PROCESS

This is a division of application Ser. No. 072,399, filed Sept. 4, 1979.

BACKGROUND OF THE INVENTION

The present invention relates to insulated gate field effect transistors and, more particularly, to insulated gate field effect transistors of the normally off type. There exists a need both for high frequency (greater than one Gigabit) integrated circuit logic and microwave and millimeter wave analog circuitry. Attempts to fabricate devices which will operate at the higher frequencies using, for example, GaAs have succeeded in the case of normally on, "depletion mode" field effect transistors, but no successful (wide dynamics range, i.e., $\gtrsim 2$ volt) normally off device has been fabricated.

SUMMARY OF THE INVENTION

The present invention provides for a normally off inversion mode metal-insulator gate field effect transistor (MISEET) on InP by depositing a drain contact and a source contact spaced apart on a p-type single crystal InP substrate, depositing a layer of silicon dioxide on the InP substrate between the source and drain contacts and depositing a gate electrode over said layer of silicon dioxide to be coextensive with the space between said source and drain contacts. In the modified embodiment, the device may be made by depositing the source and drain contacts on p-type epitaxial InP material disposed on a semi-insulating InP substrate. In manufacturing the device in this manner, the InP material is a mesa of epitaxial film.

OBJECTS OF THE INVENTION

It is an object of the present invention to provide a normally off insulated gate field effect transistor with a wide frequency range of modulation.

Another object is the provision of a normally off insulated gate field effect transistor which will operate at frequencies from dc to the mm wave range.

Other objects and many of the attendant advantages of this invention will be readily appreciated as the same becomes better understood by reference to the following detailed description when considered in connection with the accompanying drawings.

FIG. 3 is a graph of the output characteristics of the embodiment of FIG. 1.

FIG. 4 is a graph of output voltage against frequency measured at constant input voltage of the device of FIG. 1.

DESCRIPTION OF THE PREFERRED EMBODIMENTS

Figure 1:
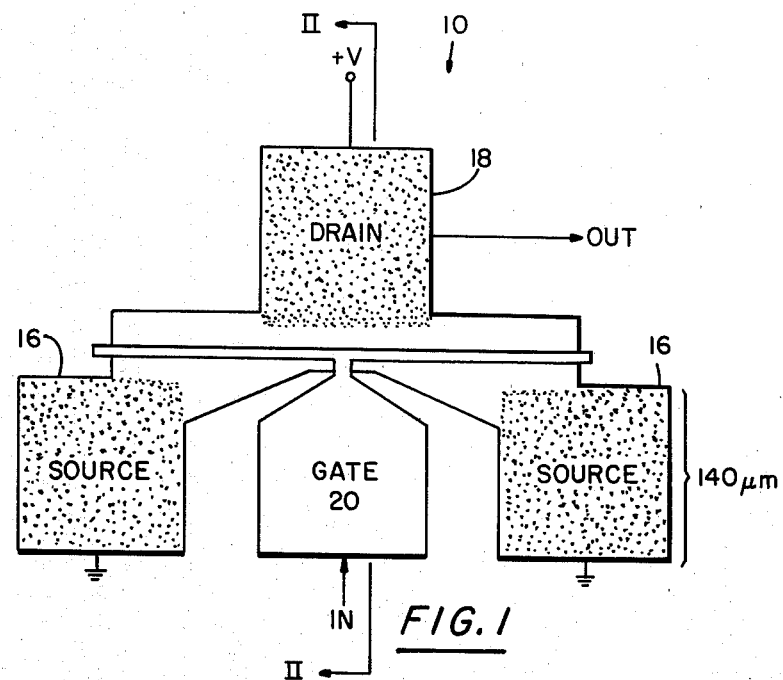
FIG. 1 is a plan view of a normally off n-channel inversion-mode InP MISFET according to the present invention.

Referring now to the drawings there are shown insulated gate field effect transistors made in accordance with the teachings of the invention. As drawn, the drawings are not necessarily to scale and in some cases are distorted for purposes of clarity.

Figure 2:
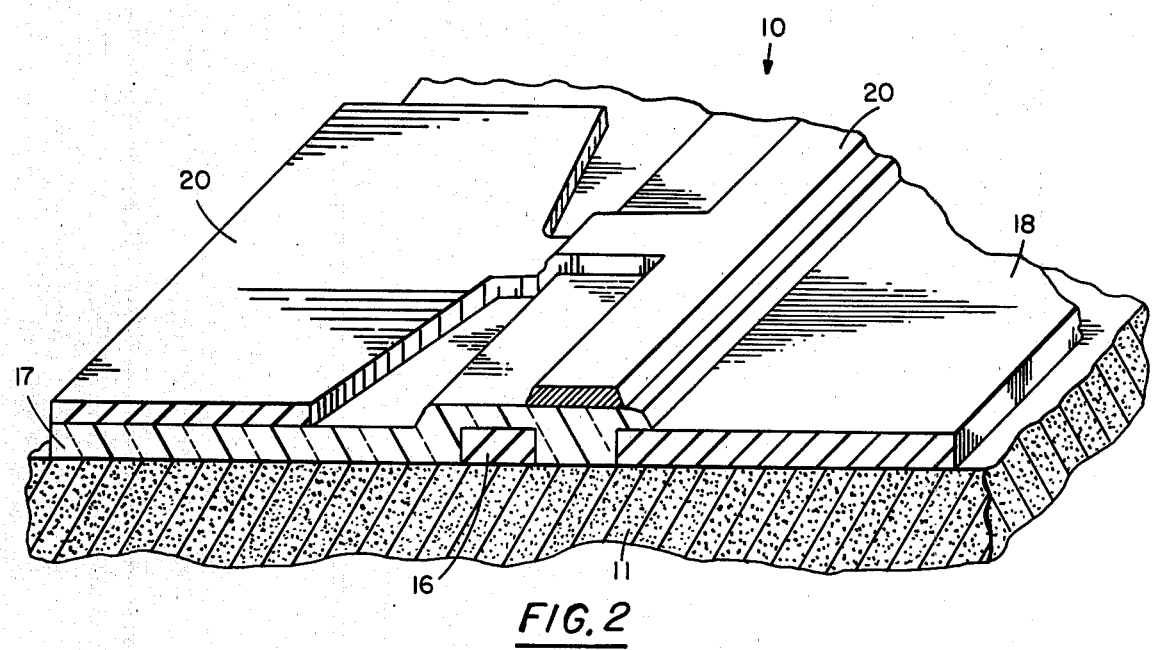
FIG. 2 is a cross section of FIG. 1 taken along lines II—II.

The device 10 shown in FIGS. 1 and 2 is fabricated on (100) oriented p-type bulk InP material 11 obtained commercially with a carrier density $\sim 1.0 \times 10^{16}$ cm$^{-3}$ and a hole mobility $\sim 95$ cm$^2$/V-sec as determined by Van der Pauw Hall measurement at room temperature. The source and drain contacts 16 and 18, respectively, were deposited using vacuum evaporation and standard photo-lithography and lift off. Contacts 16 and 18 are deposited on the bulk p-type InP surface 11 by the evaporation of 80 wt.% Au-20 wt.% Sn mixture. These contacts were then annealed at 325° C. for 15 minutes both to improve adhesion as well as to cause their alloying and diffusion into the InP. Contacts prepared in this manner exhibit rectifying characteristics with no detectable conduction on a curve tracer ($<1$ $\mu$A current) until reverse breakdown is reached at between 20 and 50 volts. Following contact anneal, a layer 17 of pyrolytic SiO$_2$ was grown on the bulk p-type material pyrolytically to between 1000 Å and 2000 Å thickness at $\sim 300°$ C. in the manner described by L. Messick, in U.S. Pat. No. 4,161,739.

Openings in the SiO$_2$ layer 17 over the source and drain contacts are then etched using standard photolithography and dry plasma etching.

This is done to permit the subsequent attaching of electrical leads. The device was completed by the evaporation of aluminum gate electrode 20 completely bridging the space between source contact 16 and drain contact 18.

The planar MISFET of FIGS. 1 and 2 was fabricated with gate lengths $\sim 3.5$ $\mu$m and gate widths $\sim 400$ $\mu$m. FIG. 3 shows the resulting output characteristics of such a device where the lowest curve corresponds to zero gate bias and the remaining curves correspond to n-channel inversion layer conduction induced by positive voltage on the gate 20. It can be seen that this inversion mode device not only exhibits true normally off behavior but also that its transconductance of 10 mmho/mm of gate width. The performance exhibited in FIG. 3 together with a per unit area gate capacitance of $\sim 3.0 \times 10^{-8}$ F/cm$^2$ suggests an electron inversion layer effective mobility in these devices of $\sim 400$ cm$^2$/V-sec. In addition, I$_{DSS}$, the saturation drain current at zero gate bias, is $\sim 3$ $\mu$A for these devices, a value somewhat larger than that to be expected from the reverse leakage characteristics of the source and drain electrodes. This enhanced current flow at zero gate bias is believed to result from the quiescent inversion that appears to exist on the InP surface.

As well as showing good performance at 120 Hz on the curve tracer, these devices also retain their transconductance at lower frequencies. FIG. 4 illustrates this.

Figure 5:
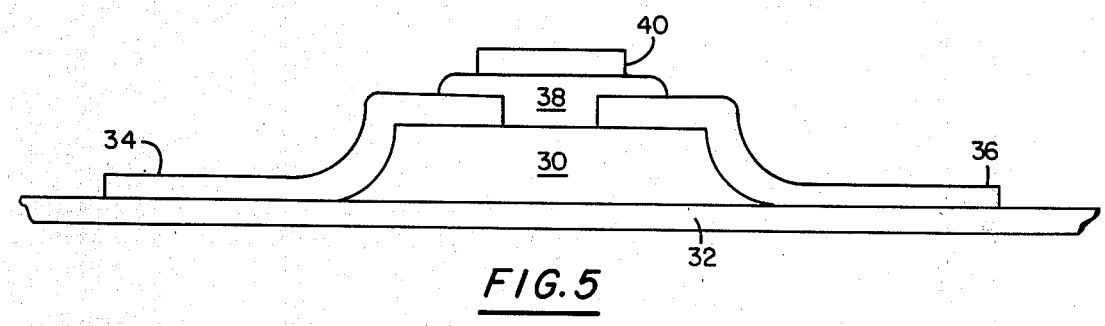
FIG. 5 is a schematic cross section of a modification of the device of FIG. 1.

In the modification shown in FIG. 5, a p-type epitaxial InP material is deposited in the form of a mesa 30 on a semi-insulating InP substrate 32. Source contacts 34 and drain contacts 36 are deposited by the evaporation of an 80 wt.% Au-20 wt.% Sn mixture in the manner discussed above in making the device of FIGS. 1 and 2. Contacts 34 and 36 were also alloyed. Following contact anneal, a layer 38 of pyrolytic SiO$_2$ was deposited on the epitaxial InP mesa 30 filling the space between contacts 34 and 36. The SiO$_2$ is deposited to cover the mesa portions of contacts 34 and 36 to provde a good insulator between the source and drain contacts and the gate electrode as shown in FIG. 5. The device was then completed by the evaporation of an Al gate electrode 40 on top of the SiO₂ layer 38 and bridging the space between contacts 34 and 36.

Obviously, many other modifications and variations of the present invention are possible in the light of the above teachings. It is therefore to be understood that within the scope of the appended claims the invention may be practiced otherwise than as specifically described.

What is claimed is:

1. In a method for producing a normally off insulated gate field-effect transistor the steps of:
    selecting a p-type single crystal indium phosphide substrate;
    disposing a source contact and a drain contact spaced apart on said substrate;
    disposing a layer of silicon dioxide over said substrate between said source and drain contacts; and
    disposing a gate electrode on said layer of silicon dioxide completely bridging the space between said source and drain contacts.

2. The method of claim 1 further comprising the step of annealing said source and drain contacts to increase resistance to hole conduction and reduce their resistance to electron flow.

3. The method of claim 2 wherein said contacts are annealed at 325° C. for 15 minutes.

4. In a method for producing a normally off insulated gate field-effect transistor, the steps of:
    selecting a semi-insulating indium phosphide substrate;
    depositing an epitaxial film of p-type semiconducting indium phosphide on said substrate;
    disposing a source contact and a drain contact spaced apart on said semiconducting material;
    disposing a layer of silicon dioxide over said semiconducting film between said source and drain contacts and disposing a gate electrode on said layer of silicon dioxide completely bridging the space between said source and drain contacts.

5. The method of claim 4 further comprising the step of annealing said source and drain contacts to increase resistance to hole conduction and reduce the resistance to electron flow.

6. The method of claim 5 wherein said contacts are annealed at 325° for 15 minutes.

* * * * *